(12) United States Patent
Hardie

(10) Patent No.: US 7,969,141 B2
(45) Date of Patent: Jun. 28, 2011

(54) INDUCTIVE PROXIMITY SENSOR AND RELATED METHODS

(75) Inventor: David Hardie, Motherwell (GB)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 12/716,030

(22) Filed: Mar. 2, 2010

(65) Prior Publication Data

US 2010/0148799 A1 Jun. 17, 2010

Related U.S. Application Data

(63) Continuation of application No. 10/345,206, filed on Jan. 16, 2003, now Pat. No. 7,719,262, which is a continuation of application No. PCT/GB01/03105, filed on Jul. 10, 2001.

(30) Foreign Application Priority Data

Jul. 20, 2000 (GB) .................................. 0017692.5
Jul. 10, 2001 (WO) ...................... PCT/GB01/03105

(51) Int. Cl.
*G01B 7/14* (2006.01)
(52) U.S. Cl. .......... 324/207.15; 324/207.13; 324/207.22
(58) Field of Classification Search .................. 327/517; 324/207.13–207.15, 207.22, 207.26
See application file for complete search history.

(56) References Cited

U.S. PATENT DOCUMENTS

| 4,135,124 A | 1/1979 | Buck ................................ 323/19 |
| 4,543,497 A | 9/1985 | Buck et al. .................... 307/308 |
| 4,551,637 A | 11/1985 | Buck et al. .................... 307/308 |
| 4,678,992 A | 7/1987 | Hametta ........................ 324/208 |
| 4,713,602 A | 12/1987 | Ueda .............................. 323/354 |
| 4,792,764 A | 12/1988 | Walker et al. ...................... 328/5 |
| 4,897,512 A | 1/1990 | Johnston ...................... 191/12.4 |
| 4,942,372 A | 7/1990 | Heimlicher ...................... 331/65 |
| 5,025,227 A | 6/1991 | Walton ............................. 331/65 |
| 5,043,679 A | 8/1991 | Kriz et al. ......................... 331/65 |
| 5,055,768 A | 10/1991 | Plagens ......................... 323/368 |
| 5,072,180 A | 12/1991 | Moreau ......................... 324/207 |
| 5,278,523 A | 1/1994 | Kriz .............................. 331/176 |
| 5,420,507 A | 5/1995 | Laskowski .................... 324/236 |
| 5,498,958 A * | 3/1996 | Tu et al. .................. 324/207.16 |
| 5,552,644 A | 9/1996 | Calder et al. |
| 5,818,129 A | 10/1998 | Fericean et al. .............. 307/116 |
| 6,031,430 A | 2/2000 | Heimlicher ...................... 331/65 |
| 6,067,026 A | 5/2000 | Weimer et al. ............. 340/686.6 |
| 6,191,580 B1* | 2/2001 | Guichard ................. 324/207.26 |
| 7,719,262 B2* | 5/2010 | Hardie ..................... 324/207.15 |

FOREIGN PATENT DOCUMENTS

| DE | 3228524 | 2/1984 |
| DE | 3440538 | 5/1986 |
| DE | 3931892 | 4/1991 |
| DE | 4200207 | 1/1993 |
| DE | 4132392 | 4/1993 |
| DE | 4232426 | 4/1993 |

(Continued)

*Primary Examiner* — Long Nguyen
(74) *Attorney, Agent, or Firm* — Seager, Tufte & Wickhem LLC

(57) ABSTRACT

An inductive proximity sensor or switch and a method of using same. The sensor or switch includes an Application Specific Integrated Circuit ("ASIC") and a plurality of external components. The ASIC is implemented in CMOS technology and has an oscillator. A switch point of the sensor or switch is predetermined by selection of a bias voltage to a potential node of the oscillator.

20 Claims, 18 Drawing Sheets

FOREIGN PATENT DOCUMENTS

| | | |
|---|---|---|
| DE | 4331555 | 3/1994 |
| EP | 0 276 113 | 7/1988 |
| EP | 311 129 A1 | 4/1989 |
| FR | 2585824 | 2/1987 |
| JP | 57032131 | 2/1982 |
| WO | WO 00/35092 | 6/2000 |

* cited by examiner

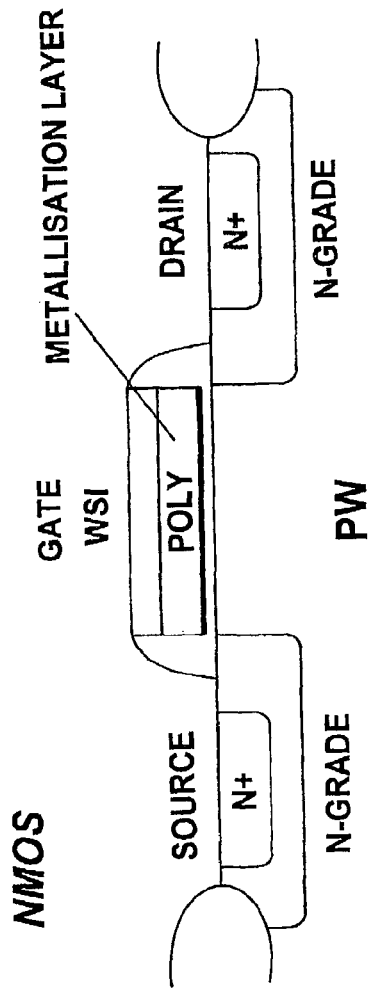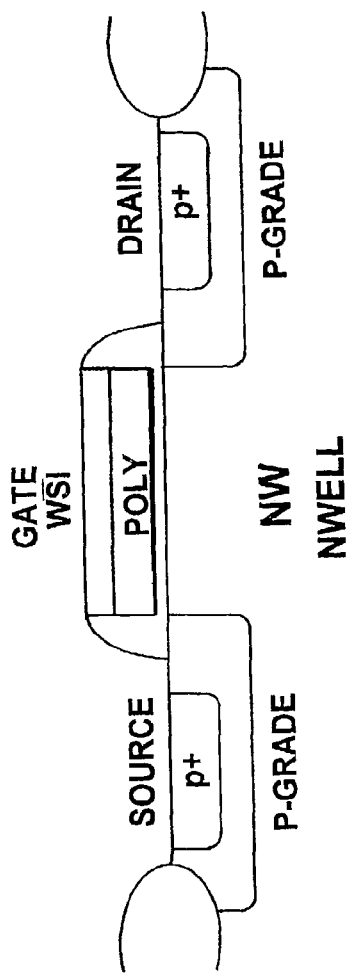
Fig. 15(A)
Fig. 15(B)

US 7,969,141 B2

INDUCTIVE PROXIMITY SENSOR AND RELATED METHODS

PRIORITY

This application is a continuation of U.S. patent application Ser. No. 10/345,206, filed Jan. 16, 2003 now U.S. Pat. No. 7,719,262, and entitled "Inductive Proximity Sensor and Related Methods", which is a continuation of International Application PCT/GB01/03105 filed Jul. 10, 2001 which claims priority to Application No. GB0017692:5, filed Jul. 20, 2000, all of which are incorporated hereby by reference.

FIELD OF INVENTION

This invention relates to an improved proximity sensor and to methods relates to the use of same. The invention particularly, though not exclusively, relates to a programmable inductive proximity switch ASIC (Application Specific Integrated Circuit) employing CMOS (Complementary MOS— Metal Oxide Semiconductor) technology.

BACKGROUND OF THE INVENTION

A number of programmable proximity switches have been previously proposed. Particularly, programming of a proximity switch, and then final trimming thereof has been proposed in the art, e.g. in: U.S. Pat. No. 5,408,132 (Sorin Fericern, et al); U.S. Pat. No. 4,713,602 (UEDA); and commercially available products from XICOR, INC of the USA which provide for remote trimming after construction. Also proposed has been an inductive proximity switch with a temperature dependent set point as in U.S. Pat. No. 5,119,004 (HOEDTMAYR et al). The content of the aforementioned prior art documents are incorporated herein by reference.

Known proximity switches suffer from a number of disadvantages, and the present invention obviates or at least mitigates one or more of these disadvantages.

SUMMARY OF THE INVENTION

The invention relates an ASIC for use in a proximity sensor which provides one or more of the following features:
  ease of programmability;
  relatively low cost (for example by a factor of 4-5 less than bi-polar technology);
  low power for a smaller area;
  operation at a relatively high voltage compared with normal CMOS operating voltages; and
  an accurate indication of the rate of change of a velocity of a target.

In first aspect of the present invention, an ASIC is provided for a proximity sensor by being implemented in CMOS technology and capable of operating at around at least 30 Volts or higher.

In a second aspect of the present invention, an ASIC is provided for a proximity sensor which: is implemented on CMOS technology; and wherein a gain/amplitude on a detection head is adjusted by modifying a bias voltage into an oscillator at a potential node. This in contradistinction to prior art devices wherein a set point has been set by the use of a plurality of series or parallel resistors which adjusted the gain/amplitude on the detection head.

In this embodiment, a switch point of an ASIC is set for use in a proximity sensor by varying a voltage at one of a plurality of nodes, e.g., one of four nodes, such as $V_{refla}$, $V_{ref}$; $V_{refl}$ or $V_{ref2}$. These nodes may be provided for adjustment of:
  trim;
  gain variation due to temperature variation of the sensor head; and
  fast internal electronic stabilization against temperature.

A third aspect of the invention provides a proximity sensor ASIC which has temperature compensation which is frequency independent and which is available within a spread of useable frequencies; and/or wherein a compensating signal is applied to only one node of an oscillator and not the whole circuit. This in contradistinction to the prior art which suffers from a problem in that it is provided with a complex compensation curve which is greatly influenced by the frequency of operation.

In this embodiment, a compensation signal is provided. This signal may be applied by adjusting a voltage at an oscillator node thereby making the sensor temperature compensation independent of frequency, i.e., the resonant frequency of the head ("head frequency"), the node being selected from one of a plurality of nodes, e.g. $V_{refla}$, $V_{ref}$, $V_{refl}$ and $V_{ref2}$.

The present invention also provides automatic internal trimming for nominal sense distance (Sn). This can be achieved by a method using a successive approximation approach.

The invention further provides an ASIC for a proximity sensor wherein the ASIC is programmed by raising a power supply input voltage.

Advantageously, the proximity sensors of the invention have a larger sense distance than has been provided by the prior art. Thus, the ASIC for a proximity sensor or switch provides enhanced quality, accuracy and ease of manufacture compared to the prior art. In addition, the switch can include pinning connections required for one purpose in the device for another purpose, for example, a pinning connection required for the power supply may be used in one embodiment for another purpose such as the programming of an ASIC.

BRIEF DESCRIPTION OF DRAWINGS

Various embodiments of the present invention will now be described, byway of example only, and with reference to the accompanying drawings which are:

FIGS. 15(a) and (b) are schematic side views of NMOS and PMOS CMOS MOSFET transistors capable of use in the present invention.

DETAILED DESCRIPTION OF DRAWINGS

Figure 1:
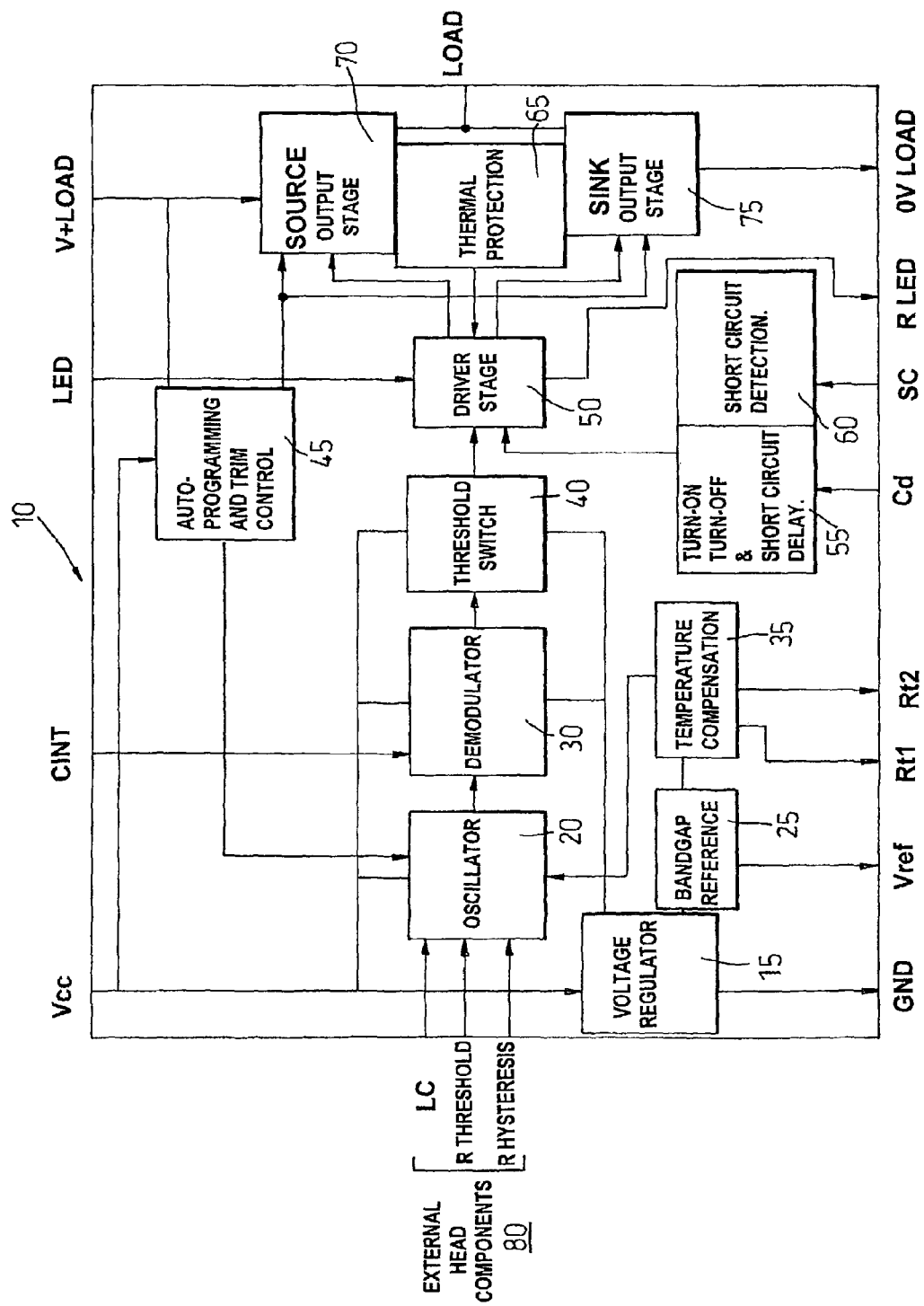
FIG. 1 is a schematic block diagram of an ASIC (Application Specific Integrated Circuit) for use in an inductive proximity sensor according to a first embodiment of the present invention.

According to a first aspect of the present invention there is provided an inductive proximity sensor having at least one CMOS component.

It will be appreciated herein that CMOS (Complementary MOS—Metal Oxide Semiconductor) is a known IC (Integrated Circuit) technology as outlined hereinafter in greater detail.

The inductive proximity sensor may comprise an inductive proximity switch.

Preferably, the inductive proximity sensor includes a plurality of CMOS components.

The inductive proximity sensor may comprise a proximity switch, i.e. have a digital output. It will, however, be appreciated that an output of the inductive proximity sensor may be analogue.

The CMOS component(s) may be selected from one or more of: transistors, resistors, capacitors, fusible links (e.g. polyfuses) or the like.

The CMOS component(s) may be made at least partly from silicon.

The present invention further provides a method of manufacturing an ASIC for use in or as an inductive proximity sensor, the method including the step of forming one or more components of the ASIC by CMOS methodology.

According to a second aspect of the present invention there is provided an inductive proximity switch having an oscillator, a switch point of the inductive proximity switch being predetermined by selection of a bias voltage to a potential node of the oscillator.

The selection of the bias voltage may adjust a gain or amplitude on the detection head.

The oscillator may comprise at least part of an ASIC forming at least part of the inductive proximity switch.

The present invention further provides a method of setting a switch point of an inductive proximity switch by selecting a bias voltage to a potential node of an oscillator of the inductive proximity switch.

According to a third aspect of the present invention there is provided an inductive proximity sensor including an oscillator and means for substantially maintaining an output voltage from the oscillator, the maintenance means comprising temperature compensation means.

The inductive proximity sensor may comprise an inductive proximity switch.

The temperature compensation means may act to maintain the output voltage if and when a temperature of the oscillator varies, in use.

The temperature compensation means may provide a temperature compensation signal which may be applied to a node of the oscillator.

The temperature compensation means may comprise a temperature compensation circuit.

The inductive proximity sensor may provide a bandgap reference block circuit which acts to provide a bandgap reference block circuit voltage which is substantially constant with temperature, and which produces a variation signal indicative of any change applied to the temperature compensation circuit and so to the oscillator.

According to a fourth aspect of the present invention there is provided a method of substantially maintaining an output voltage from an oscillator of an inductive proximity sensor comprising the steps of:

providing temperature compensation means;
establishing a temperature compensation signal from the temperature compensation means;
maintaining the output voltage by means of the temperature compensation signal.

According to a fifth aspect of the present invention there is provided an inductive proximity sensor including an oscillator and wherein, in use, a bias voltage of the oscillator is selected by means of a plurality of successive approximation steps.

The inductive proximity sensor may comprise an inductive proximity switch.

The inductive proximity sensor may include an n-bit converter which suitably changes a voltage applied to a control node of the oscillator.

The inductive proximity sensor may include an analogue-to-digital (a-to-d) converter.

The present invention also provides a method of selecting a bias voltage of an oscillator of an inductive proximity sensor including the step of carrying out a plurality of successive approximation steps.

According to a sixth aspect of the present invention there is provided an inductive proximity sensor wherein an output functionality of the inductive proximity sensor is programmed or selected by application of a predetermined voltage to a power supply input of the inductive proximity sensor.

The inductive proximity sensor may comprise an inductive proximity switch.

The application of the predetermined voltage may cause one or more fuses to fuse (blow).

In a preferred embodiment the predetermined voltage may be applied to code signal processing means which produce a code signal which may be applied to a plurality of fuses so as to fuse (blow) one or more of the fuses thereby setting a functionality of the inductive proximity sensor.

The functionality may be selected from:
sink open, source open, sink closed, source closed.

The present invention further provides a method of programming or selecting a functionality of an inductive proximity sensor including the step of:
applying a predetermined voltage to a power supply input of the inductive proximity sensor.

According to a seventh aspect of the present invention there is provided an ASIC (Application specific Integrated Circuit) for use in an inductive proximity sensor or switch according to any of the foregoing aspects of the present invention.

According to an eighth aspect of the present invention there is provided an apparatus including an inductive proximity sensor or switch according to any of the foregoing aspects of the present invention.

Referring initially to FIG. 1, there is illustrated a schematic view of an ASIC (Application Specific Integrated Circuit) generally designated 10 according to an embodiment of the present invention. The ASIC 10 provides a voltage regulator 15, an oscillator 20, a band gap reference circuit 25, a demodulator 30, a temperature compensation circuit 35, a threshold switch 40, an auto programming and trim control circuit 45, a driver stage 50, a turn-on turn-off and short circuit delay circuit 55, a short circuit detection circuit 60, a thermal protection circuit 65, and source output stage 70 and sink output stage 75.

Figure 2A:
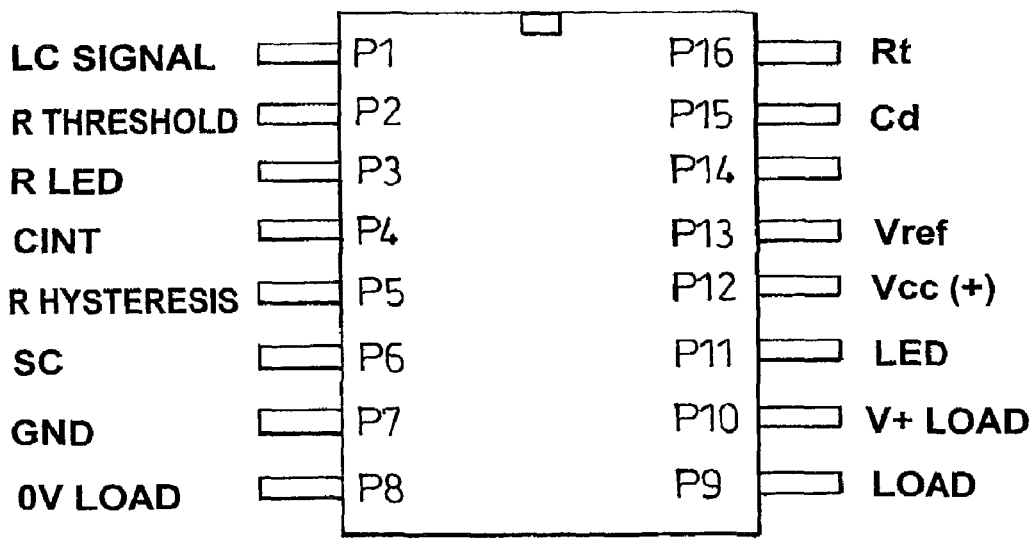
FIGS. 2(a) to (c) are a top view, a further top view and an end view, respectively, of a package for the ASIC of FIG. 1 showing sixteen pin connections.

As can be seen from FIG. 2(A) and from FIG. 1, the ASIC 10 may be connected to an external environment by a plurality of pins PI-PI 6. Pins PI, P2 and P5 are connectable to inductive proximity sensor head components as are conventionally provided in the art. Pin PI may be connected to an LC circuit while pin P2 may be connected to a resistor Rthreshold, and pin P5 to a external resistor Rhysterisis. Pin P3 is connectable to an external resistor Rled; pin P4 to a capacitor Cint; pin P6 to a short circuit; pin P7 to ground; pin P8 to a zero volt load; pin P9 to a load; pin P10 to supply connection for load current V+LOAD; pin PI 1 to an external LED; pin P12 to a positive supply volt Vcc; pin PI3 to a reference voltage Vref; pin PI5 to a external capacitor Cd; and pin PI6 to an external resistor Rt.

Figure 2B:
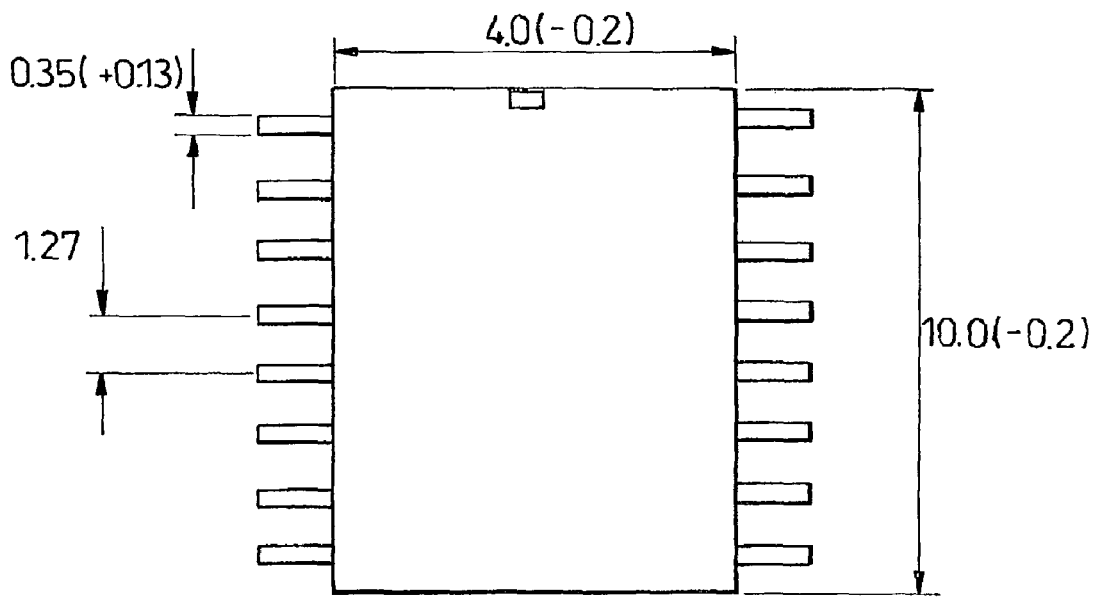
Figure 2C:
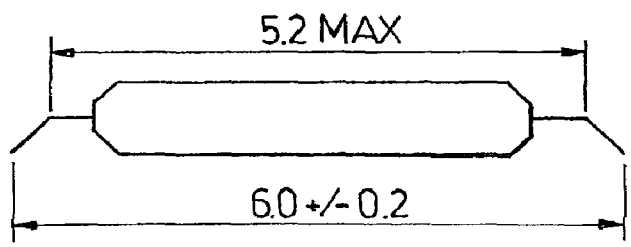

FIG. 1 illustrates provision of resistors Rt1 and Rt2 so as to provide dual scope compensation of stability of the oscillator signal. However, it will be appreciated that only one resistor Rt may instead be provided as shown in FIG. 2 and in FIGS. 8 to 12.

Figure 3:
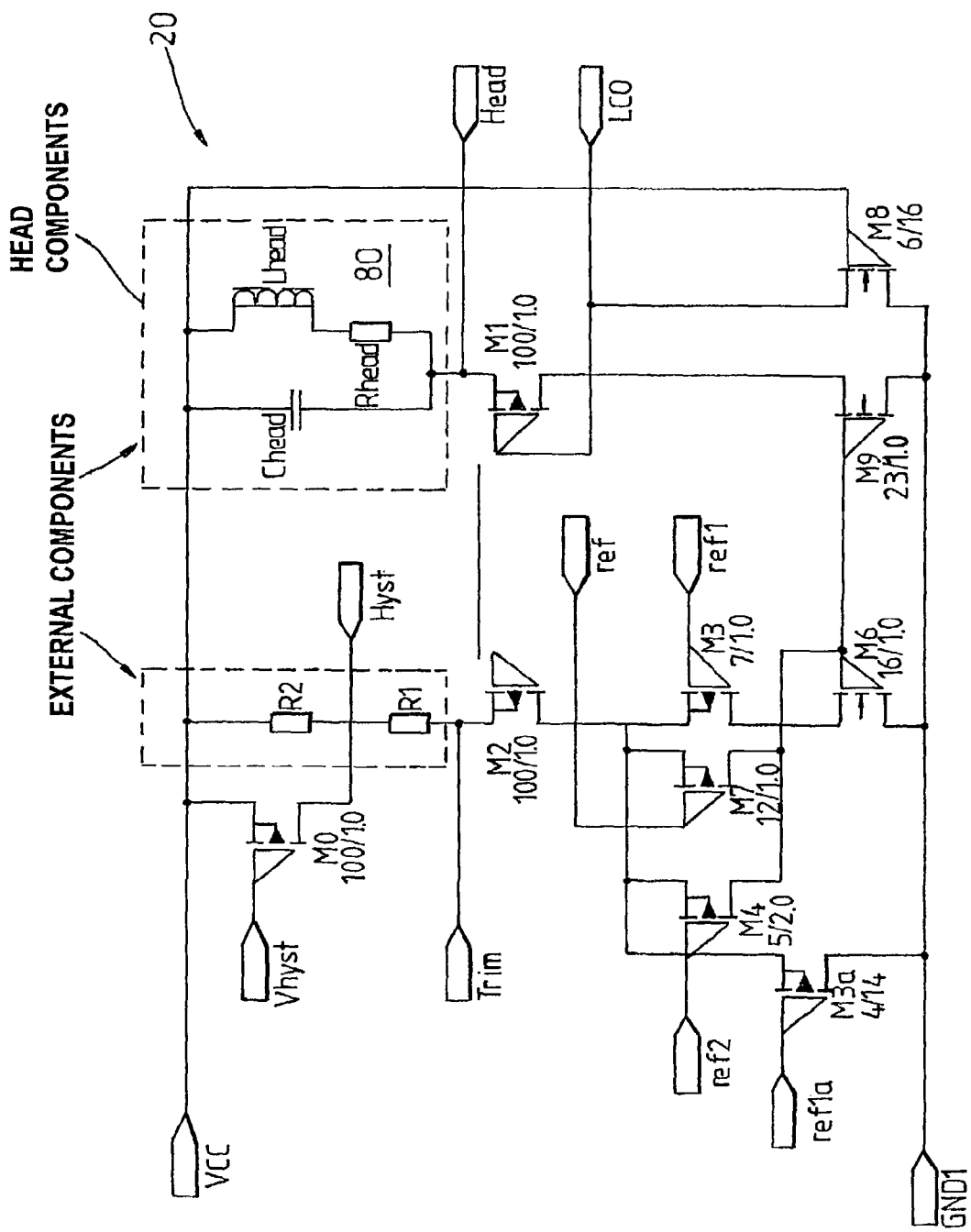
FIG. 3 is a circuit diagram of an oscillator forming part of the ASIC of FIG. 1.

Referring now to FIG. 3, there is shown a circuit diagram of the oscillator 20 of the ASIC 10. As can be seen from FIG. 3 the oscillator 20 comprises a plurality of suitability connected CMOS transistors, the oscillator 20 being connected to external head components 80 comprising Chead, Lhead and Rhead and further external components R1 and R2 which provide a course gain setting.

Figure 4:
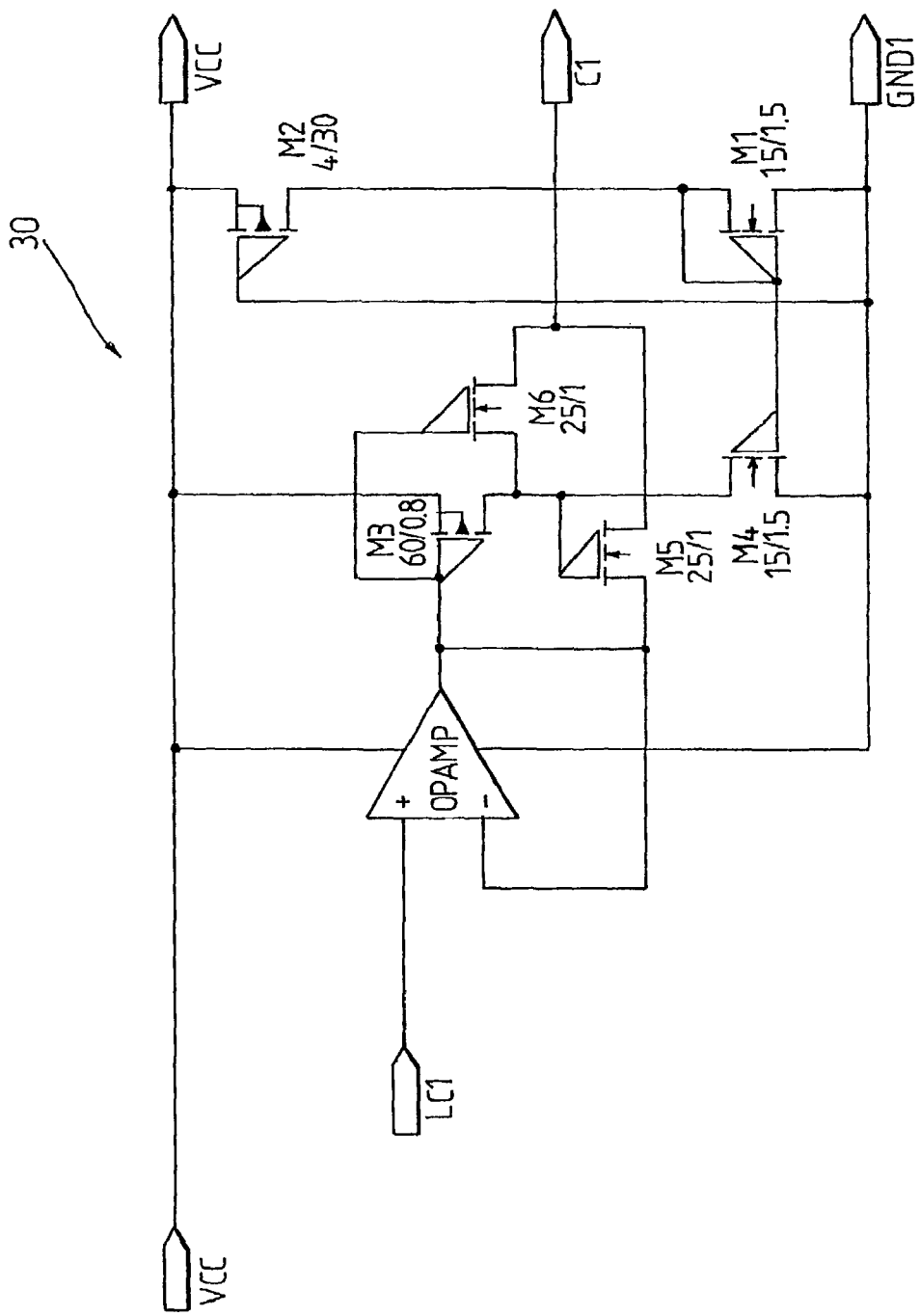
FIG. 4 is a circuit diagram of a demodulator forming part of the ASIC of FIG. 1.

Referring to FIG. 4 there is shown a circuit diagram of the demodulator 30 of the ASIC 10. As can be seen from FIG. 4, the demodulator 20 comprising a plurality of CMOS transistors suitability connected with a CMOS op-amp.

Figure 5:
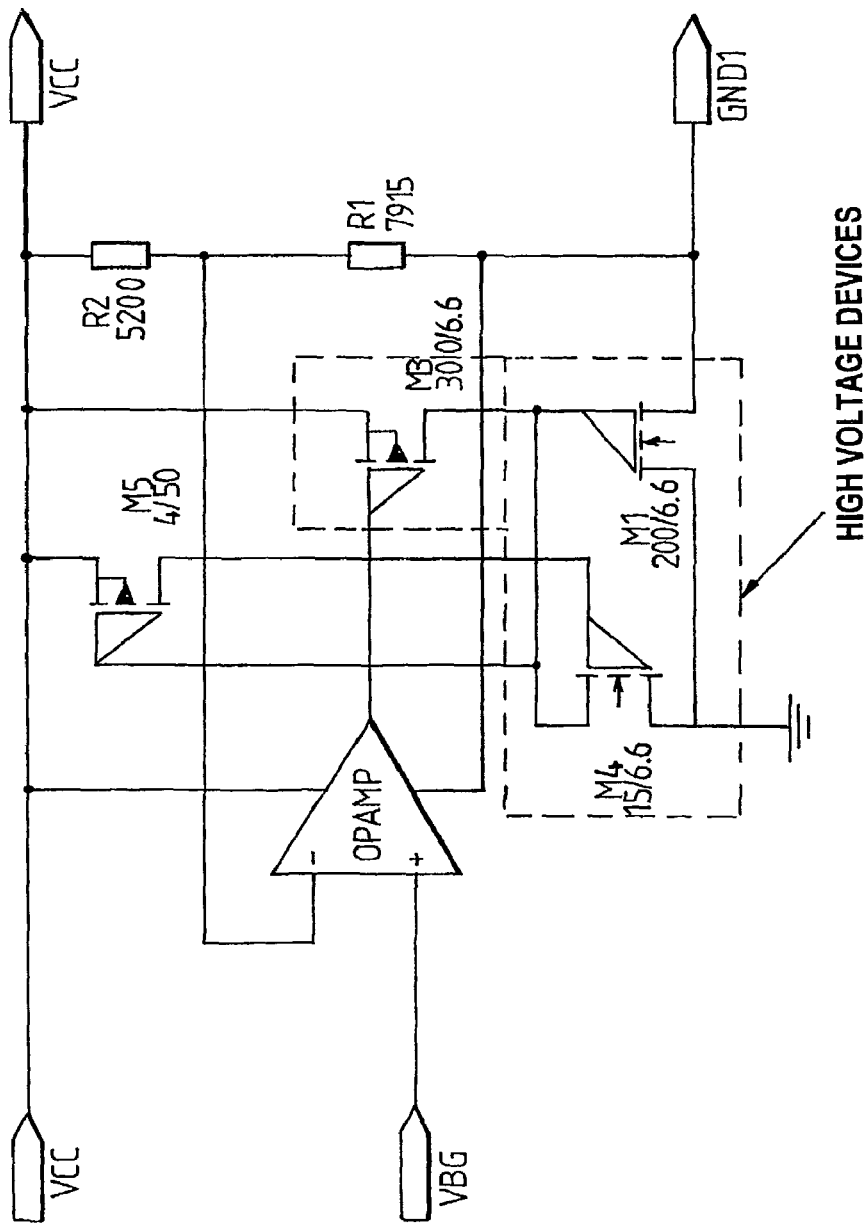
FIG. 5 is a circuit diagram of a voltage regulator forming part of the ASIC of FIG. 1.

Referring to FIG. 5 there is shown a circuit diagram of the voltage regulator 15 of the ASIC 10. As can be seen from FIG. 1 the voltage regulator 15 comprises a plurality of CMOS transistors and resistors suitably connected with a CMOS op-amp.

Figure 6:
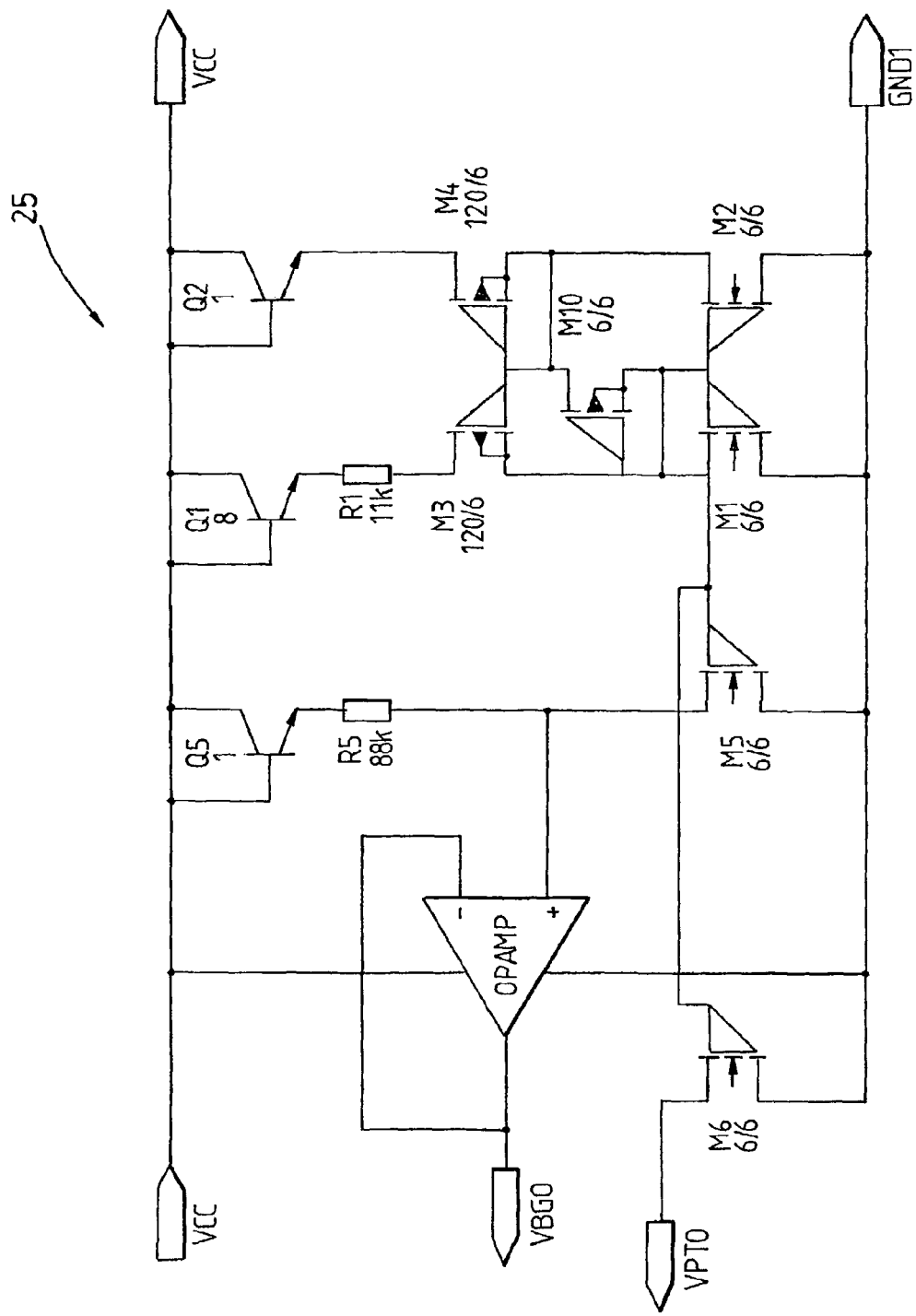
FIG. 6 is a band gap reference circuit forming part of the ASIC of FIG. 1.

Referring now to FIG. 6 there is shown a circuit diagram of the band gap reference circuit 25 of the ASIC 10. As can be seen from FIG. 6 the band gap reference circuit 25 comprises a plurality of CMOS transistors and resistors suitability connected with a CMOS op-amp.

Figure 7A:
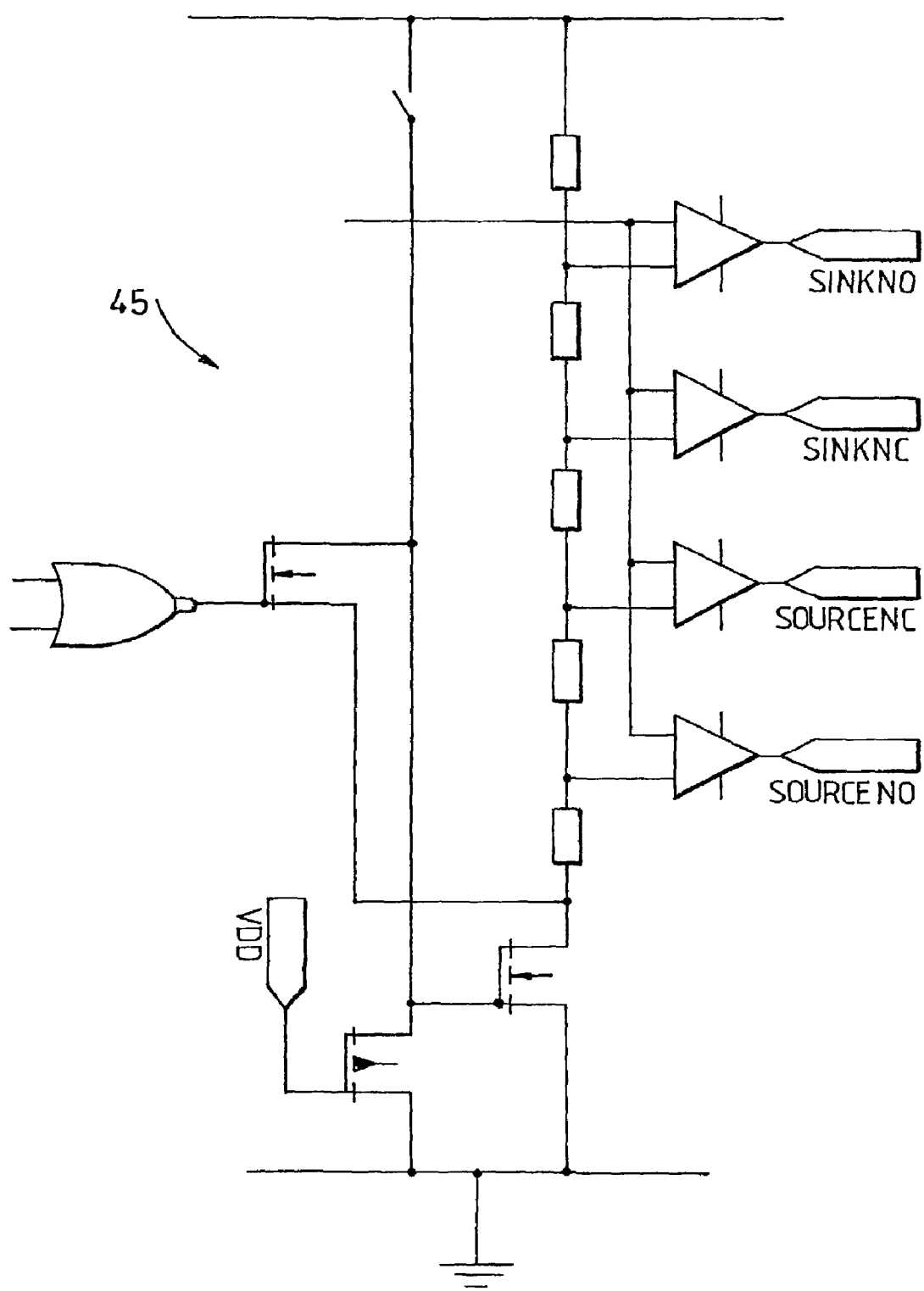
FIGS. 7(a) and (b) are circuit diagrams of portions of an auto-programming and trim control circuit forming part of the ASIC of FIG. 1.
Figure 7B:
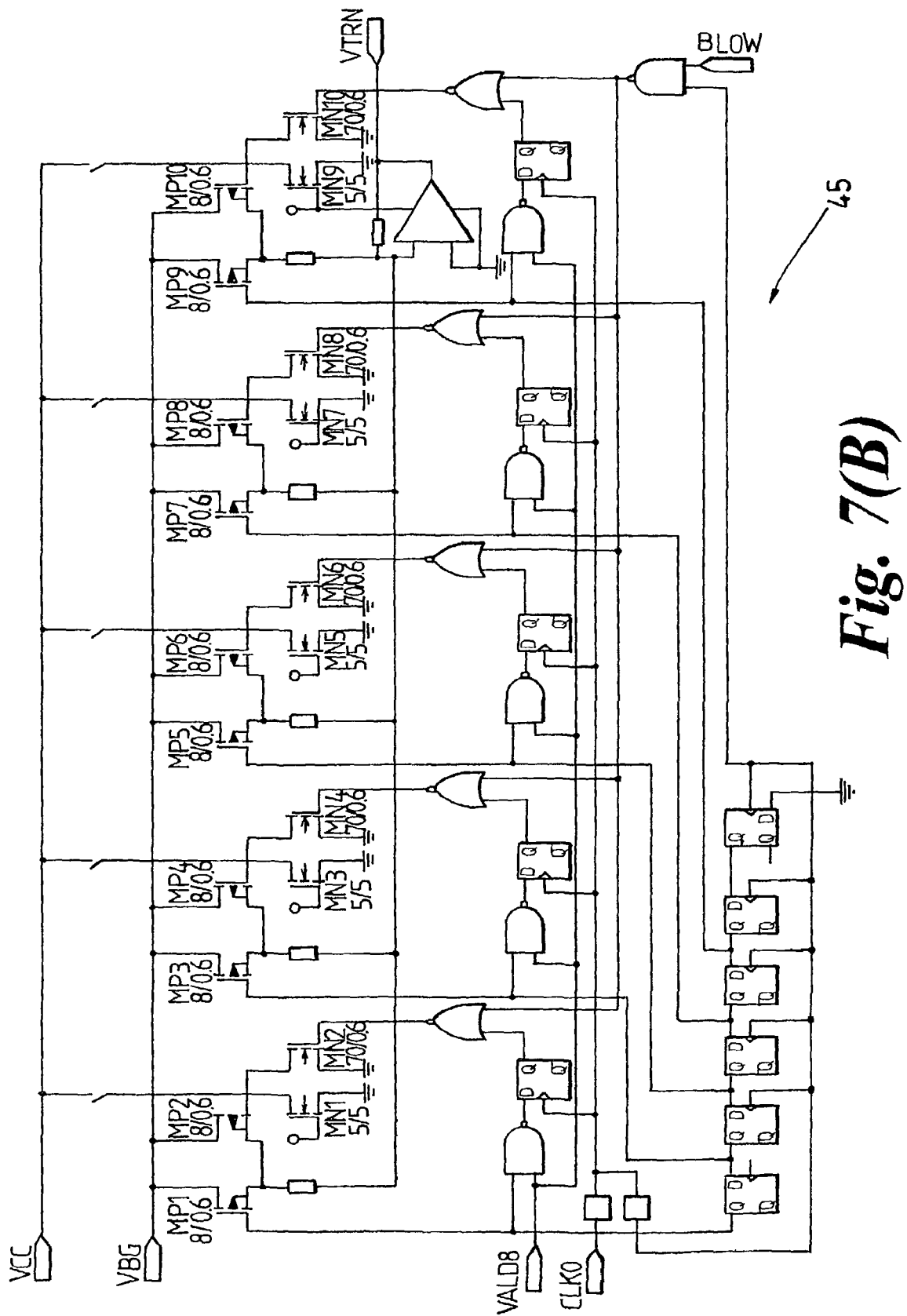

Referring now to FIGS. 7(A) and (B) there is illustrated circuit diagrams relating to an embodiment of the auto-programming and trim control circuit 45 of the ASIC 10. As can be seen from FIGS. 7(A) and (B) the programming and trim control circuit 45 comprises a plurality of CMOS components suitably connected one to the other.

Figure 16:
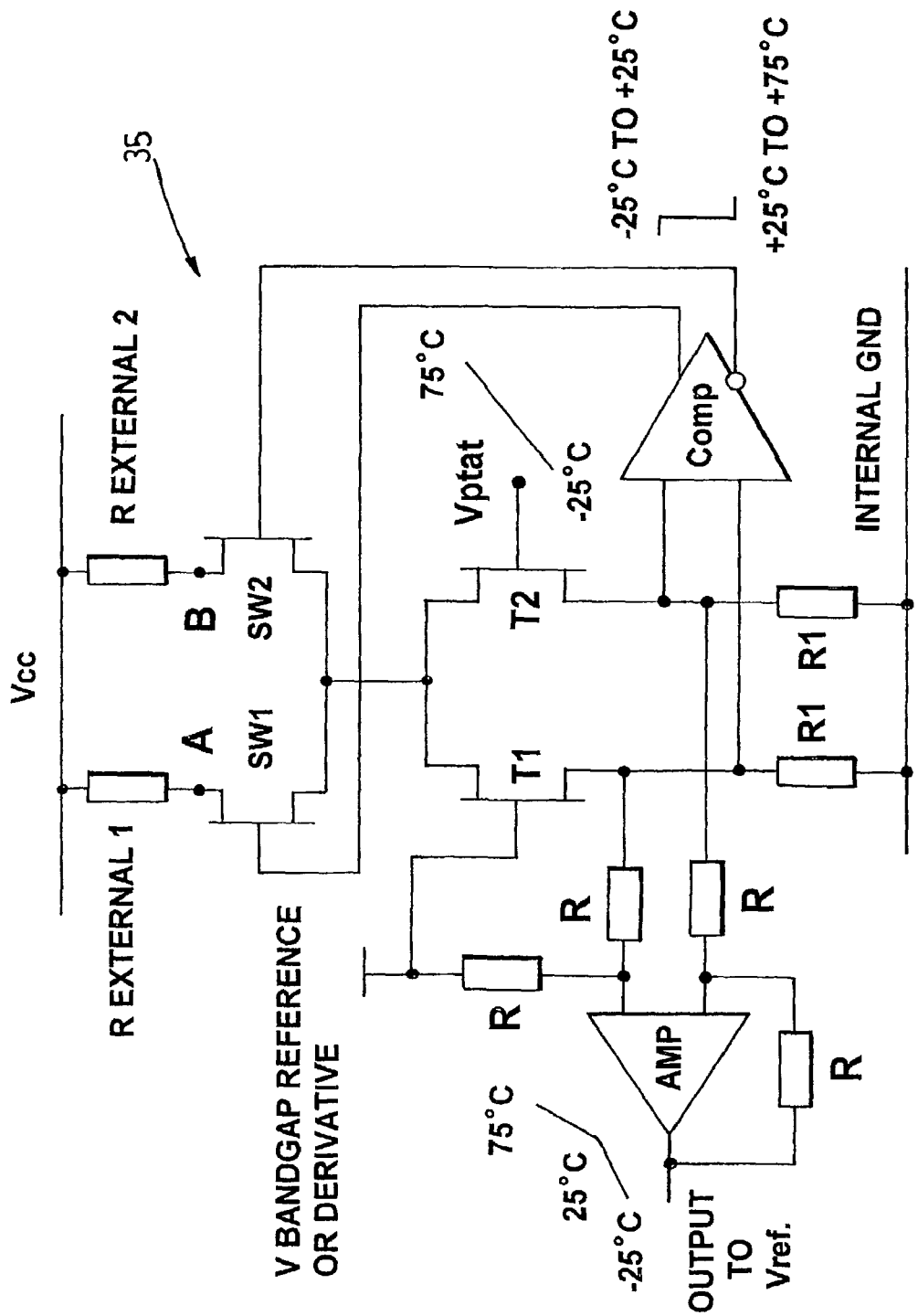
FIG. 16 is a circuit diagram of a temperature compensation circuit forming part of the ASIC of FIG. 1.

Referring now to FIG. 16, there is shown a circuit diagram of the temperature compensation circuit 35 of the ASIC 10.

The voltage proportional to absolute temperature signal, Vptat, derived from the bandgap circuit is applied to one side of a matched transistor pair T1 and T2. Within the temperature range $-25°$ C. to $+25°$ C. the comparator closes SW1, SW2 is open circuit, such that R external 1 defines the current applied to transistors T1 and T2.

Vptat's positive dv/dt produces a positive voltage increase from the amplifier output with a slope proportional to the current defined by R external 1. At $+25°$ C. the Vptat signal will equal the bandgap reference voltage and the comparator closes SW2, SW1 is now open circuit, and the external resistor, R external 2, now defines the current applied to transistors T1 and T2.

As the Vptat increases with increasing temperature, the output amplifier outputs a positive voltage increase with a slope proportional to R external 2.

The amplifier's output is applied to a gain control node of the LC Oscillator and is used to compensate for the Q variation of the sensing head with respect to temperature.

The following points should be noted:
1. Two pins only, A and B, are required to connect the external resistors Rexternal 1 and Rexternal 2;
2. It is essential that the output amplifier is configured with the four resistors R as illustrated so that when there is a step change of current through the matched pair at $25°$ C. there is no step change at the Output. It is also a prerequisite that the V bandgap, or a derivative, equals the Vptat voltage at $25°$ C.;
3. Some degree of hysteresis will be necessary around the comparator to avoid chatter at the $25°$ C. switch point.

Figure 8:
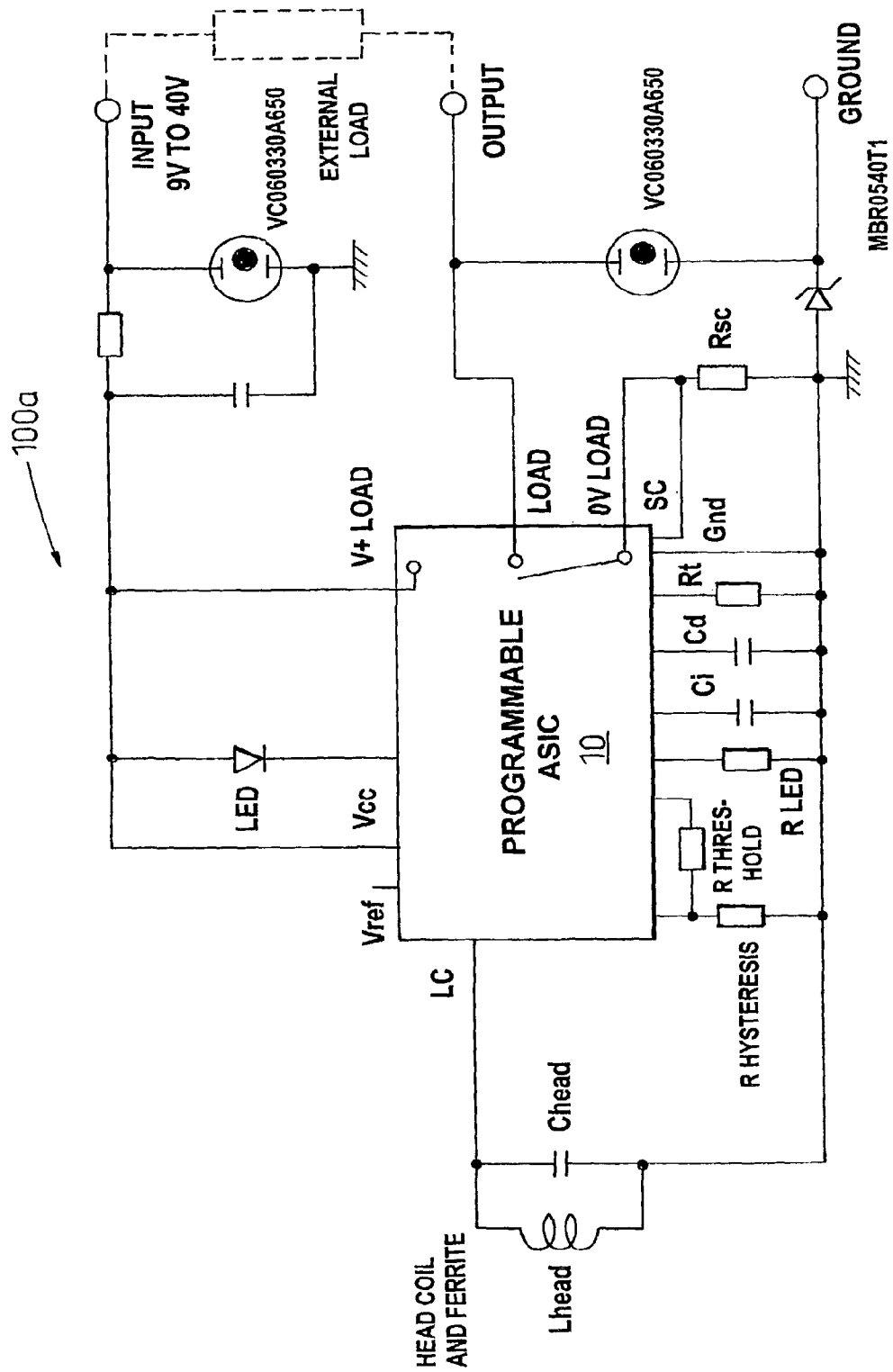
FIG. 8 is a circuit diagram of an inductive proximity sensor according to a first embodiment of the present invention.

Referring to FIG. 8, there is illustrated a first embodiment of a inductive proximity sensor 100a incorporating the ASIC 10 of FIG. 1. In this embodiment the external components to the ASIC 10, as shown in FIG. 8, are arranged such that the proximity sensor 100a comprising the ASIC 10 and external components is configured in a three-wire DC sink configuration.

Figure 9:
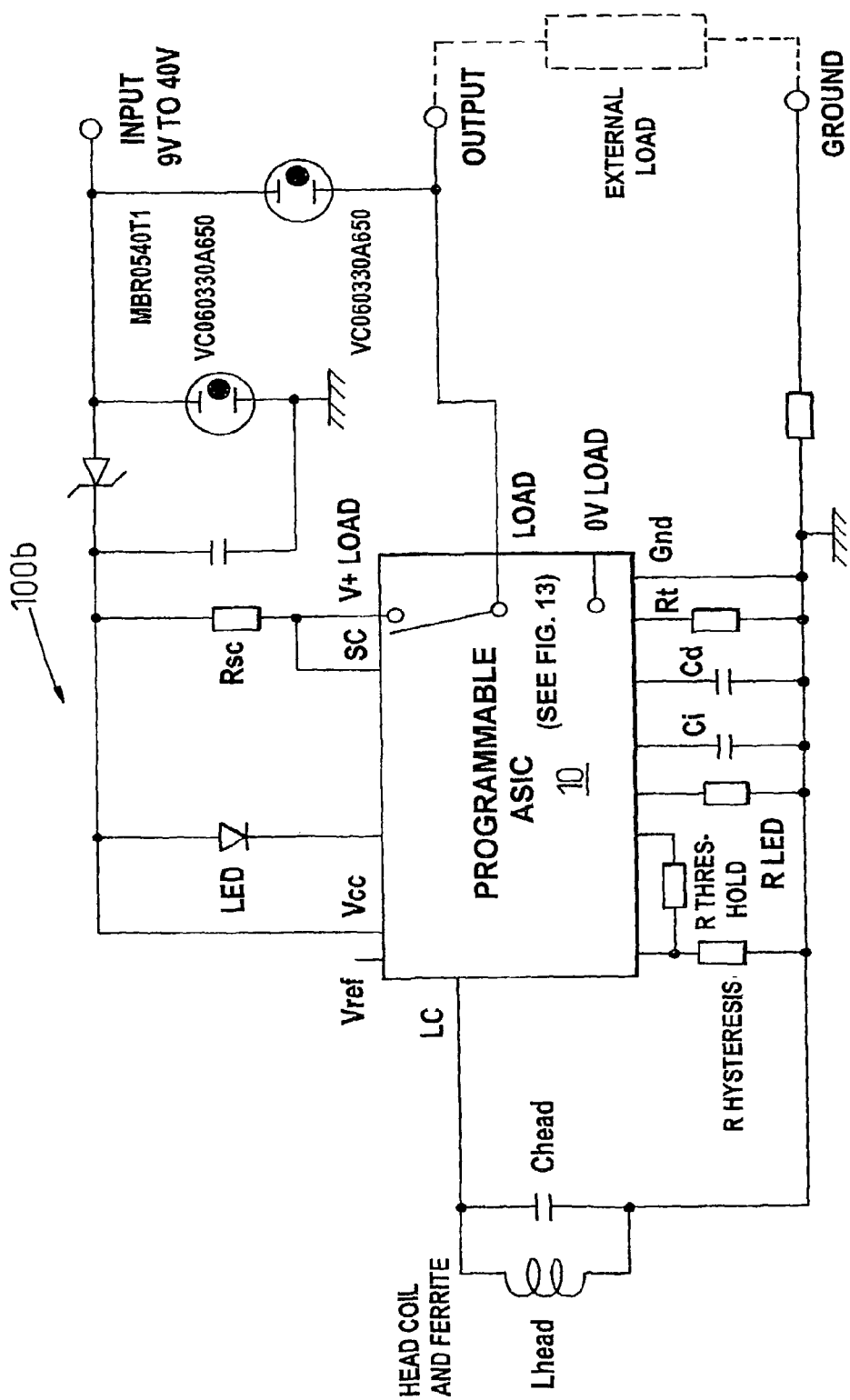
FIG. 9 is a circuit diagram of an inductive proximity sensor according to a second embodiment of the present invention.

Referring to FIG. 9 there is shown a second embodiment of an inductive proximity sensor generally designated 100b according to the present invention. As can be seen the conductive proximity sensor 100b comprises the ASIC 10 and a plurality of external components which are suitably connected in a three-wire DC source configuration.

Figure 10:
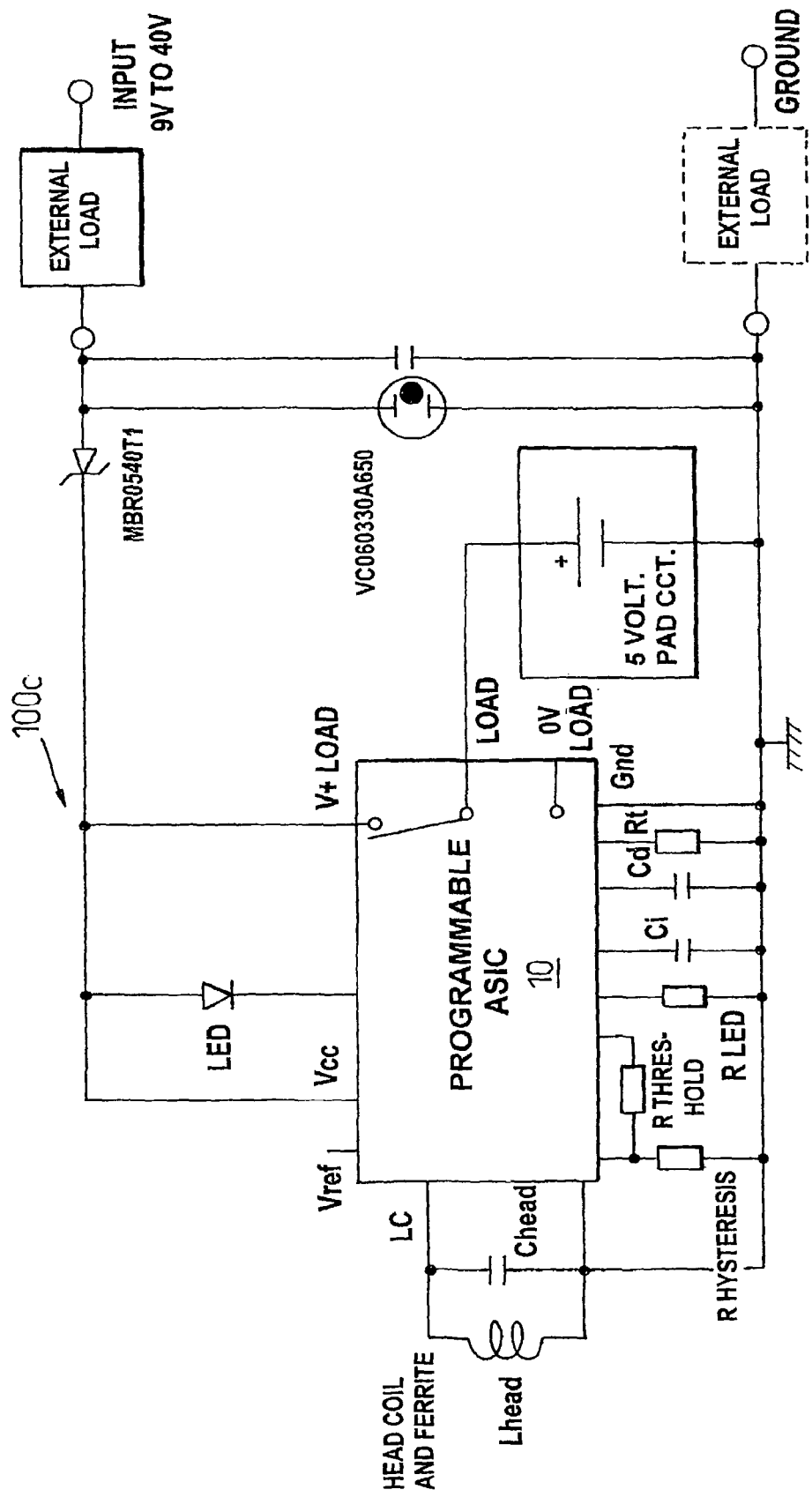
FIG. 10 is a circuit diagram of an inductive proximity sensor according to a third embodiment of the present invention

Referring now to FIG. 10, there is shown a third embodiment of an inductive proximity sensor 100c according to the present invention, the inductive proximity sensor 100c comprising the ASIC 10 and a plurality of external components. As can be seen from FIG. 10 the ASIC 10 and external components are connected such that the inductive proximity sensor 100c provides a two-wire DC source configuration.

Figure 11:
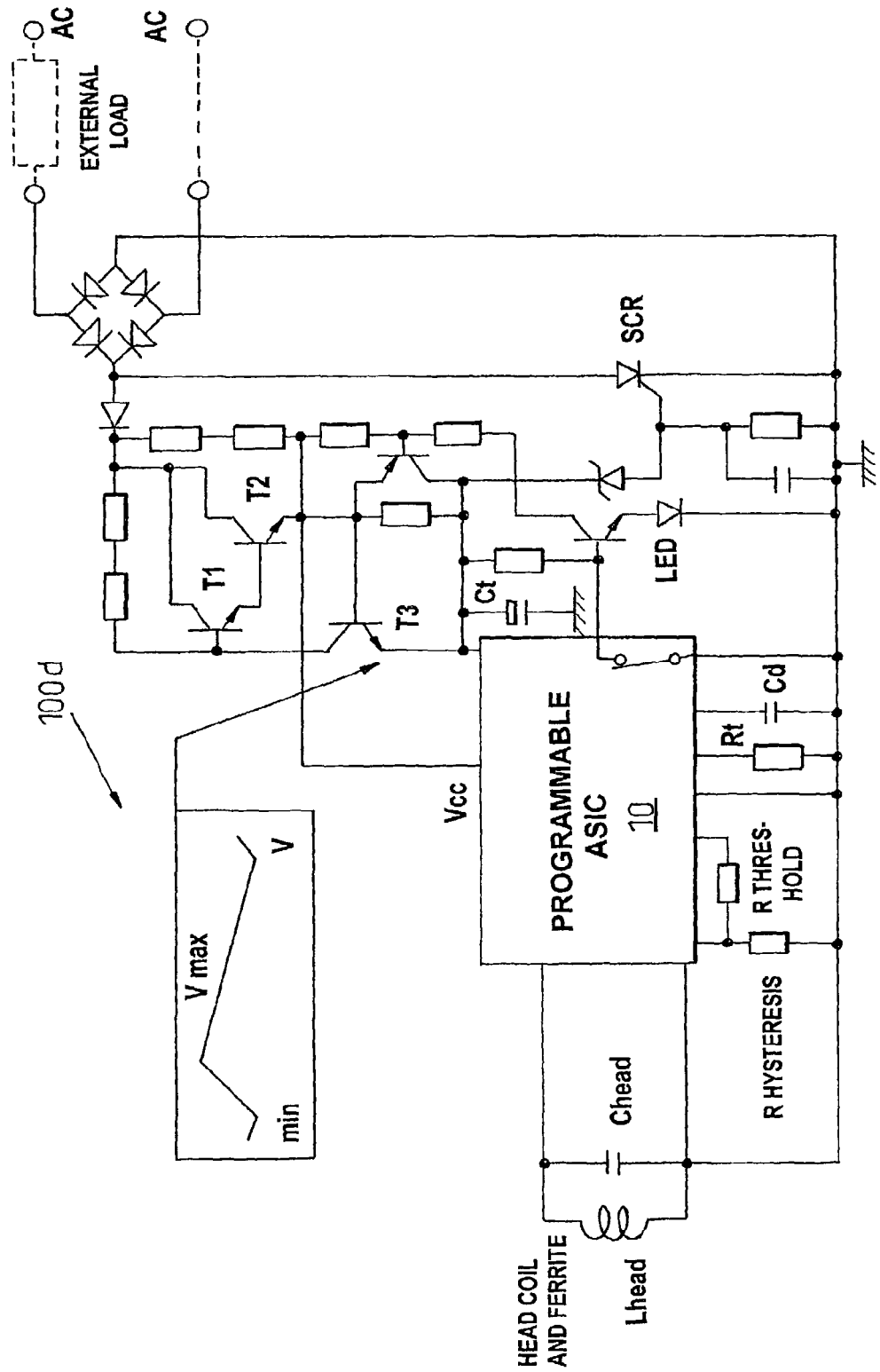
FIG. 11 is a circuit diagram of an inductive proximity sensor according to a fourth embodiment of the present invention.

Referring now to FIG. 11, there is shown a fourth embodiment of an inductive proximity sensor 100d according to the present invention, the inductive proximity sensor 100d comprising the ASIC 10 and a plurality of external components. As can be seen from FIG. 11, the ASIC 10 and plurality of external components are in this embodiment connected such that the inductive proximity sensor 100d provides an embedded two-wire AC configuration.

Figure 12:
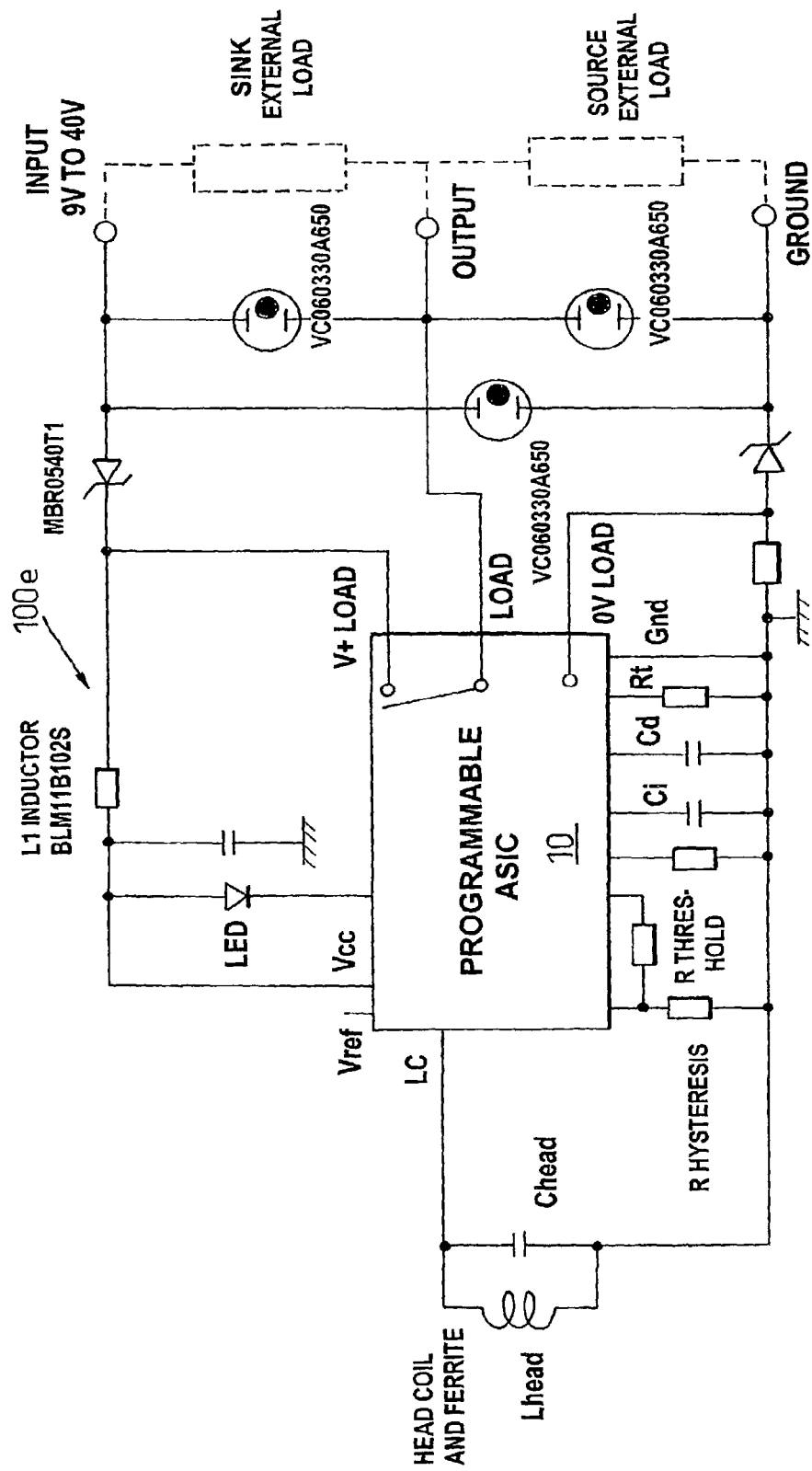
FIG. 12 is a circuit diagram of an inductive proximity sensor according to a fifth embodiment of the present invention.

Referring now to FIG. 12, there is shown a fifth embodiment of an inductive proximity sensor, generally designated 100e, according to the present invention. As can be seen from FIG. 12, the inductive proximity sensor 100e comprises the ASIC 10 and a plurality of external components. As can be seen from FIG. 12, the inductive proximity sensor 100e comprising the ASIC 10 and plurality of external components are in this embodiment connected such that the inductive proximity sensor 100e provides a sink or source three-wire DC configuration.

The three-wire sink and three-wire source configurations both use three-wires, namely, + supply, 0 Volts and Output. The switched load current flows in the Output and 0 Volts wires in the sink configuration and in the Output and + supply wires in the source configuration.

The two-wire DC configuration uses two wires, + supply and 0 Volts, and there should always be a series load resistor placed in the + supply or 0 Volt line. When switched, the two-wire configuration is so designed that a supply voltage exists between the + supply and 0 Volt wires so maintaining a supply to the sensor electronics.

The two-wire AC configuration is similar to the two-wire DC configuration in that when switched a voltage is maintained to bias the sensors' internal electronics. The two-wire AC input is supplied from an AC source and the sensor switching decision is made during every cycle of applied AC input.

Figure 13:
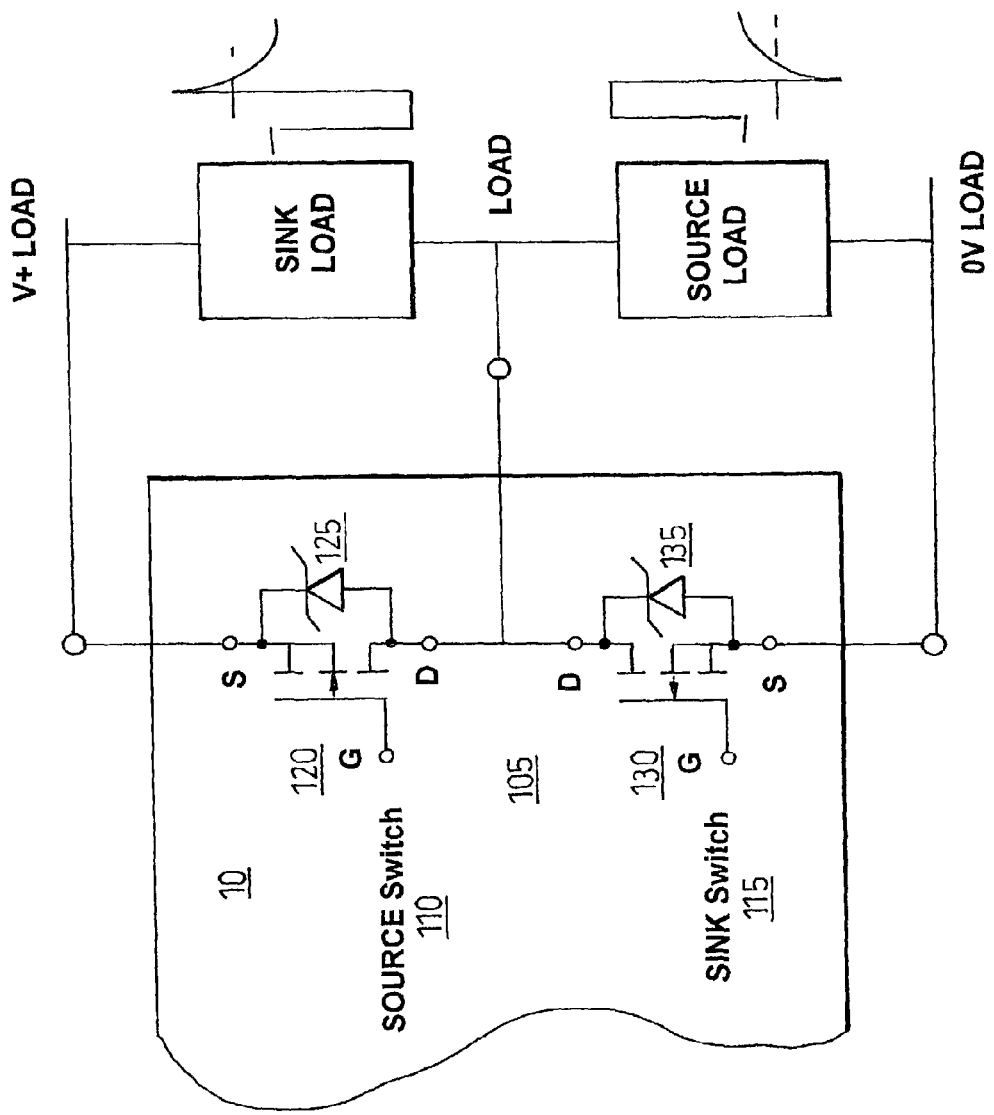
FIG. 13 is a schematic circuit diagram of a portion of the inductive proximity sensor according to the second embodiment of FIG. 9.

Referring to FIG. 13, there is shown a more detailed circuit diagram of a portion of the ASIC 10 comprising a selectable output stage 105, e.g. for use in one or more of the aforementioned embodiments. The selectable output stage 105 comprises a source switch 110 and a sink switch 115. The source switch 110 comprises a CMOS transistor 120 and protection diode 125, while the sink switch 115 comprises a CMOS transistor 130 and protection diode 135.

It is envisaged in a preferred embodiment of the ASIC 10 that the ASIC 10 will be implemented in CMOS silicon technology having most components produced at a submicron level, e.g. around a 0.6 micron level, high voltage components being perhaps produced at around a 6 micron level. Complementary MOSFETs (Metal Oxide Field Effect Transistors)—NMOS and PMOS (see FIGS. 15(A) and (B)) are combined as a pair in Complementary Metal Oxide Semiconductor (CMOS) technology. CMOS devices can be used in conjunction with other similar stages all having essentially capacitive input impedance and therefore zero DC current flow. In a basic CMOS inverter comprising a p-channel and n-channel transistor pair, the p-channel device conducts when an input is low and the n-channel device conducts when the input is high, thus giving an output that is an inversion of the input.

The ASIC 10 is used within an inductive proximity 100a-e and contains an oscillator 20 (whose signal amplitude will be quenched by a metal target), demodulator 30, threshold switch 40, driver stage 50 and both sink and source output stages 70, 75. A voltage controlled oscillator signal amplitude can be modified through one of four bias nodes refla, ref, ref1 or ref2 and these inputs are used for automatic sense distance trimming, temperature compensation of a switch point, and non zero quenching control. The inductive proximity sensor 100a-100e will be completely assembled before the applied supply voltage activates the auto-programming and trim control circuit 45 to compute then fuse the internal sense distance setting and the desired normally open or normally closed and sink or source functionally. The desired functionality is encoded in the value of voltage applied to the sensor 100a-e. Once fused the inductive proximity sensor or switch 100a-e trim and functionally characteristics cannot be altered.

Referring to FIGS. 1 and 3, the LC oscillator 20 may be implemented in standard CMOS technology and is made up of two cross coupled current mirrors M1, M2 and M5, M6. The current ratios between input and output of the oscillator arrangement is controlled by the external series resistors R1 and R2 on an input side and an impedance of the Head arrangement made up of Chead, Lhead and Rhead on an output side. An oscillator frequency is determined by the resonant characteristic of the head inductor Lhead and shunt capacitor Chead.

To ensure the oscillator 20 starts up at switch on it is necessary to bias the current mirror M1/M2. Transistor M8 acts as a current source to bias diode M1 on sufficiently to activate transistor M2. Varying the values of R1 or R2 will alter the amplitude of the sinusoidal signal on a resonant tank circuit. R1 is a course selection for a particular LC Head design and R2 sets the Hysteresis level of the switch. R2 is shunted by an internal switch M9, controlled by node Vhyst, such that when the head signal is quenched and reaches a switch point switch M9 reverts to a high impedance, thus increasing the trim resistance and reducing the Head signal.

The circuit of oscillator 20 provides inputs for fine adjustment of the head amplitude. These inputs, Vref1 a Vref, Vref1 and Vref2, can be used for switch point trimming, temperature compensation and non zero amplitude quenching.

Referring now to FIGS. 1 and 4, the demodulator 30 circuit consists of a unity gain buffer amplifier at an input. The demodulator function is achieved by charging and discharging an external capacitor proportional to the amplitude of the modulated signal. The charging and discharging of the external capacitor (Ci) is accomplished by the four transistors M3 to, M6, where transistors M5 and M6 function as directional switches to charge and discharge respectively the external capacitor. A ripple associated with an oscillator frequency is filtered out by an RC network formed by the on resistance of transistor M5 or M6 and the external capacitor Ci. Transistor M3 operates as a common source inverter and is biased by a current source M4. A current in M4 is derived by transistors M2 and M1.

Likely key parameters of the ASIC 10 are expected to be as follows:

Supply voltage Vcc Range: 4 to 40 volts;
Operating temperature range: −40° C. to +85° C.;
LC Head Frequency: up to 2 Mhz;
Current Consumption: 0.7 mA, Maximum;
Output stage Current: typically 200 mA, SINK or SOURCE, with Vds<=250 mV;
Switching frequency: up to 5 Khz;
Temperature compensation: the ASIC 10 may compensate for the LC temperature characteristic;
Target ASIC die dimensions: 1.9×1.9 mm Nominal;
Mode selection and trim data transfer to be actioned via the supply line Vcc
Additional embedded trim and programme sequence;
Polyfuse Trim resolution: 5 bits min;
Blown polyfuse open circuit duration: infinite.

In use the ASIC 10 is used within the design of inductive proximity switches (digital output). The standard proximity switch requirement for an LC tank circuit is realised with an open half-pot ferrite and parallel capacitor. Proximity switch IC's commonly use an oscillator whose frequency is defined by the resonance of the LC parallel tank circuit and a demodulator to detect a change of oscillator amplitude. When a metallic object enters the electromagnetic field of the oscillator coil, eddy currents are induced in this coil which quench the amplitude of oscillation. This reduction in Q and hence reduction in peak amplitude is tracked by a demodulator such that if this signal fails to exceed the sense distance threshold the output stage is activated.

The Q of the inductor head will vary with temperature and in general as the temperature rises the Q falls and the Q rises as the temperature falls. If left uncompensated this change of Q would create large changes in Nominal Sense Distance, Sn, with temperature. It is therefore necessary to build positive temperature compensation into the oscillator 20 to counteract the negative temperature coefficient of the sensor head 80.

Further, to the basic inductive proximity sensor control requirements this programmable ASIC 10 automatically trims internally for nominal sense distance Sn following power up. It is necessary, in this pre-programmed state, to locate the proximity switch at the requirement sense distance from a standard target to achieve the optimum internal setting. During the programming cycle a lock bit is also set such that the IC will thereafter set up in normal mode (see below)—i.e. it cannot be reprogrammed. It is also possible within the trimming cycle to define the mode of operation of the proximity sensor as SINK or SOURCE and normally open switch (N.O.) or normally closed switch (N.C.).

This ASIC 10 should be such that when used within a host proximity switch 100a-e it's control characteristics will ensure total compliance with the International standard specification IEC 947-5-2.

The ASIC 10 can operate in two modes, namely:
1. Programming Mode
2. Normal Mode Dealing firstly with on initial power-up of the ASIC 10 an automatic trimming routine is initiated followed by a programming sequence.

An internal LOCK bit is set at the end of the programming sequence and this prohibits any future changes. During the trim sequence the basic functions (oscillator, demodulator and threshold switch) operate normally but the ASTC 10 output stage 70,75 remains in a high impedance state until a final Polyfuse LOCK bit is blown.

The trim sequence should be enabled with the proximity sensor 100a-e powered up in a standard test jig and the target set at the required sensing distance. A time delay from power-on exists before the Trim/Programme sequence starts. Logic on the ASIC 10 causes the sensitivity to be varied in sequence until the optimum switch point is achieved.

A value of applied voltage on the initial Power-up determines the functionally, SINK or SOURCE and Normally Open or Normally Open or Normally Closed, that will be programmed into the sensor 100a-e.

Figure 14A:
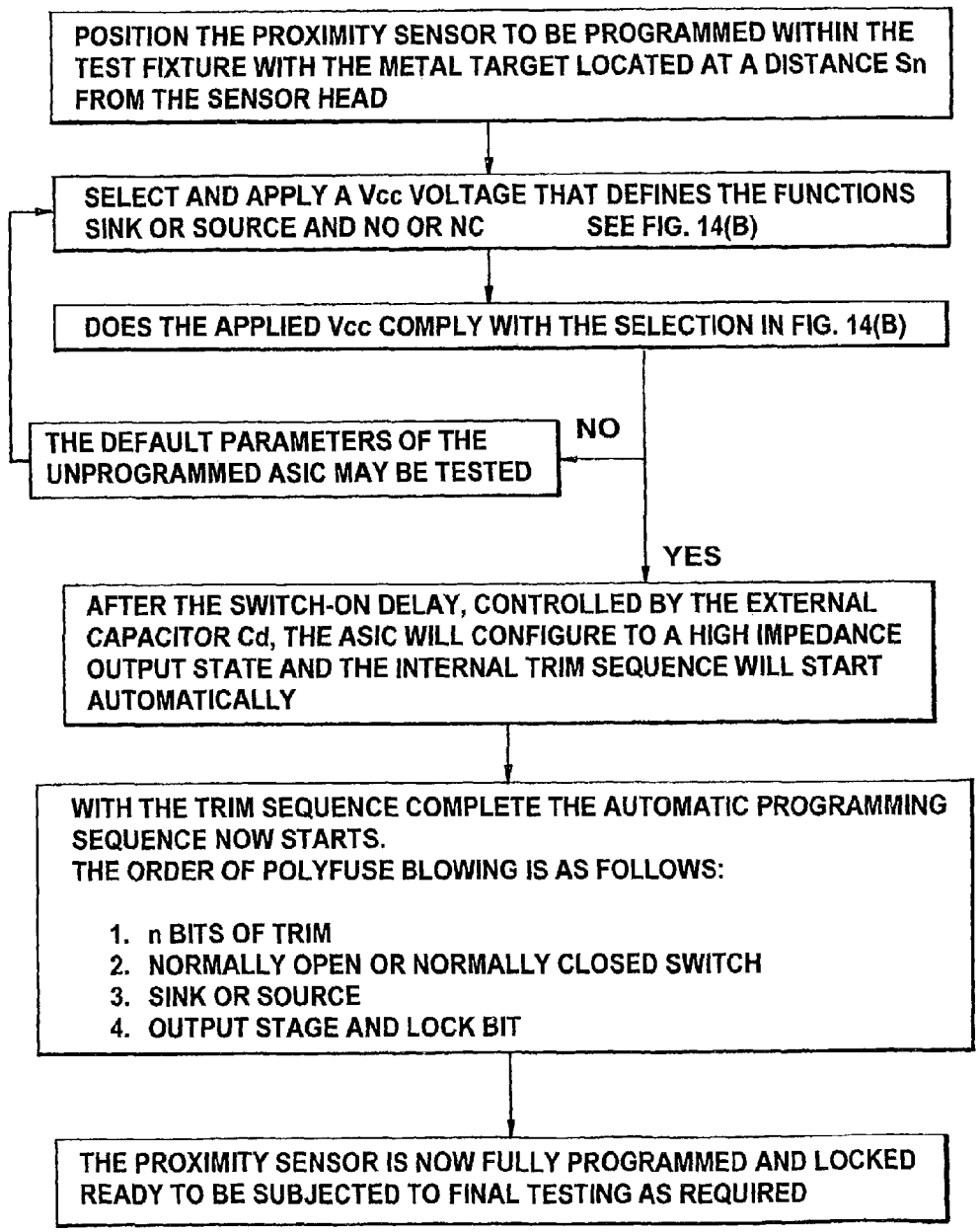
FIGS. 14(a) and (b) are graphical representations of a trim and programming sequence to be carried out on the inductive proximity sensor according to any of the first to fifth embodiments of FIGS. 8-12, respectively.
Figure 14B:
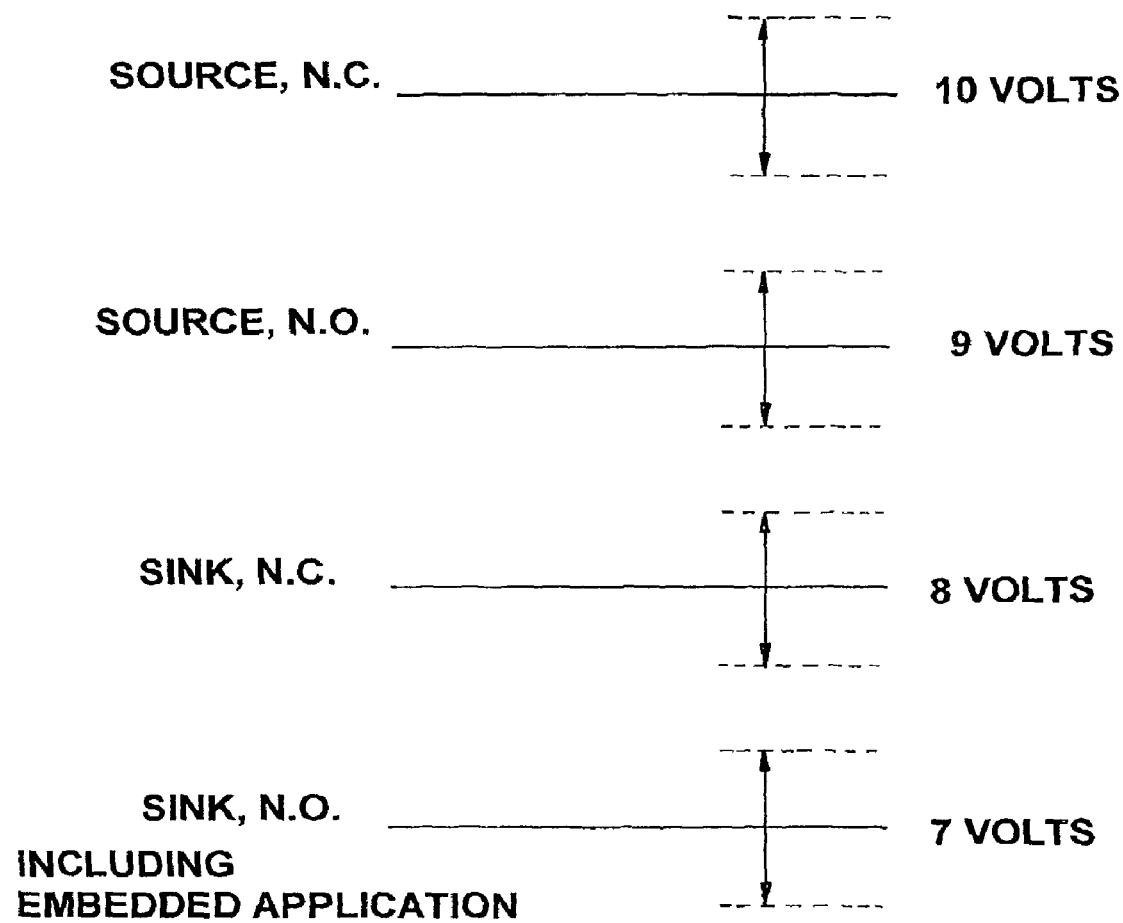

A standard trim and programming sequence is illustrated in FIGS. 14(A) and (B).

A "successive approximation" method is used, wherein, for example, these may be used at least 5 bits providing a minimum resolution of 1 part in 31. At the commencement of the trimming sequence the most significant bit, MSB, representing 50% of the adjustment magnitude is applied to the oscillator gain control node. This will result in a reduction of the oscillator signal amplitude. If this change causes the threshold switch to operate then the MSB will NOT be retained as an active part of the fuse blowing code and will NOT be used in the subsequent bit tests. If however the reduced oscillator amplitude does not operate the threshold switch then the MSB will be an active bit of the fuse blowing code and will be retained for all of the remaining bit tests. The second step in the sequence is to apply the MSB-1 bit and the MSB, if the MSB was previously declared to be used in the remaining bit tests, and discard least significant bit LSB-1 if the threshold switch is operated or retain the LSB-1 if the threshold switch does not operate. This procedure is repeated all the way down to the least significant bit, LSB, so producing a binary code that is used for trim fuse blowing.

Turning now to the Normal Mode, in normal mode, with the LOCK bit set, the ASIC 10 will operate with normal regulation control.

Dealing next with the various pin P1-P16 functions:—

LC: The resonant LC circuit of the proximity switch 100a-e is connected between LC and ground.

Rthreshold: An external resistor connected between this pin and Ground combines with an internal trim circuit to establish the sense distance.

Cint: To achieve high noise immunity this pin should be terminated with a series RC combination, Ri, Ci. If Cd is not used, a correctly defined RC combination on this pin will also prevent any erroneous pulses on the output when the supply voltage is turned ON.

Rhy: This external resistor to ground defines the amount of distance hysteresis to be set.

SC: This input provides short circuit sensing in the output circuit to be protected. The current can be sensed referred to Vcc or GND. The current sensing is made by a dedicated resistor in the external switch circuit. For a voltage drop=>300 m volts between Vcc and SC in the SOURCE configuration or between SC and Vss in the SINK configuration, all outputs are turned off after the turn-FF delay. The outputs will turn-ON again after a predefined time but if the short circuit is still present, the turn-OFF cycle will repeat. Both the internal output stages and externally connected output stages can be protected against prolonged short circuits or overload.

As an alternative a thermal protection circuit internally monitoring the driver output stage 50 may replace the above current monitoring scheme but still activate the 200:1 Off/On fault drive signal.

With a short circuit, the current signal form is as follows:
Typical Turn-Off/Turn-On ratio is 200:1, determined by Cd.

Vcc: In normal mode the LOAD output is inhibited if the voltage on Vdd is below 3 Volts. The LOAD output is enabled between 3 and 3.5 Volts and the basic function of the ASIC 10 is enabled. During the turn-ON and turn-OFF of Vcc there are no undesirable static states. In normal trim mode prior to the internal LOCK bit being fused and with a suitable metal target set at the nominal sense distance Sn in front of the sensor, the potential on Vcc can be raised to fall within one of a number of voltage windows enabling the final function of the Proximity sensor 100a-e to be selected. The selections available are SINK or SOURCE along with the selectable default switch status either Normally Open (N.O.) or Normally Closed (N.C.).

The table below details the options available and the voltage window to select them.

|  | SINK | SOURCE |
|---|---|---|
| NORMALLY OPEN (N.O.) | Vcc = 7 volts | Vcc = 9 Volts |
| NORMALLY CLOSED (N.C.) | Vcc = 8 volts | Vcc = 10 Volts |

Vref: The internal stabilized voltage of the ASIC 10 of 3 Volts appears on this pin. The internal analogue functions of the ASIC 10 are independent of the supply voltage.

Cd: A capacitor on this pin delays the activation of the outputs after the supply voltage is applied, turn-ON delay. In this way erroneous pulses are prevented on the output during oscillator ramp up.

If Vdd falls below 3 volts, the outputs are not inhibited until after a turn-OFF delay time which is also determined by Cd. In this way the delayed turn-ON operation is suppressed if there are short duration impulses on Vdd.

The capacitor Cd also sets the turn-OFF delay and the pause duration in short circuit operation via the current sense input or from the internal thermal protection circuit.

Rt or Rt1 or/and Rt2: This resistor or resistors will determine the delta Q vs temperature characteristic. If a dual slope compensation arrangement is selected then two external resistors will be required.

Rled: a resistor connected to this pin defines an LED current.

LED: an LED cathode is connected to this pin.

GND: This is the zero volts terminal for the ASIC 10.

Load: In general the proximity sensor's load is connected to the LOAD terminal.

V+Load: This terminal is necessary if an external over current sense resistor is used.

Ov Load: This terminal is necessary if an external overcurrent resistor sense resistor is used.

It should be noted that if short circuits and over-loads can be sensed and managed by an internal thermal sensing arrangement then the V+Load and Ov Load terminals will be surplus to requirements.

Turning now to Embedded Trim/Programming Mode, there is an application where direct access to the Vcc line is not possible, as with the embedded 2-wire AC design illustrated in FIG. 11.

A trim operation starts by placing a target at the required distance from the face of the sensor 100d. For this specific arrangement, where the applied voltage is less than 8 volts the trim sequence will commence with the default conditions SINK and (N.O.). hi both cases, (N.O.) or (N.C.), of this particular application the ASIC switch will be in the non-conducting state during the programme sequence.

The external design of the two-wire AC configuration dictates a slow rate of rise in supply voltage to the ASIC 10; therefore the ASIC internal programming sequence cannot start until the applied supply has stabilised.

Dealing now with temperature Compensation, the coil and ferrite assembly used with a Proximity sensor 100a-e will exhibit a frequency dependent temperature response; therefore, temperature compensation will be required from the ASIC oscillator 20.

It is desirable that the oscillator 20 can be set to compensate for head Q variation with temperature to ensure a constant amplitude of oscillation versus temperature as this will maintain a constant switch point Su versus temperature.

The oscillator temperature compensation for Head Q change with temperature should range up to 0.1 Q/° C. by suitable selection of a temperature compensation resistor.

It will be appreciated that the embodiments of the invention hereinbefore described are given by way of example only and are not meant to limit the scope thereof in any way. It will also be appreciated that the invention provides a number of advantages over the art.

Firstly it will be understood that the programmability of the ASIC of the present invention allows an inductive proximity sensor to be fully assembled prior to defining an output switch configuration and sense distance. The number of electronic variants required for a family of inductive proximity sensors can therefore be greatly reduced due to the flexibility of the ASIC. Sensors in production can be fully assembled, left unprogrammed and sorted or shipped for definition later. The ability to programme the ASIC at short notice provides enhanced responsiveness to a customer by shipping upon receipt of order.

Alternatively a customer can hold a stock of unprogrammed sensors and with a suitable programming module, programme a required functionality and sense distance within the mounting location. This ability of completing the sensor build and programming the sensor in its working location enhances the operational quality and reduced installation time. In certain circumstances the ability to program the sensor in situ may develop applications previously difficult or impossible to satisfy.

Secondly it will be understood that the automatic programme control sequence may be initiated by applying the supply voltage to the sensor, and in so doing avoids need for a dedicated programming input. The magnitude of supply voltage applied determines a finished functionality of the sensor. The position of the target relative to a sensors' face further determines a sense distance. Once programmed the sensor parameters cannot be altered or reprogrammed.

Thirdly, it will be understood that it is possible during the sensors' programming sequence to select a normally open (N.O.) or normally closed (N.C.) output switch. Two output devices may be integrated into the sensor one Sink and one Source, and during the programming sequence it is possible to select a Sink or Source sensor output stage, e.g. able to switch 200 mamps. At the end of the programming sequence a programme complete lock bit is set ensuring that the functionality cannot be changed or corrupted for the life of the sensor.

Fourthly it will be understood that a fully assembled sensor may be trimmed by setting the sensor at a distance from a target equal to a sense switching distance required. On application of a voltage to the power supply input to the sensor an internal timing sequence iterates through an n-bit weighting and optimizes the sensor switch setting. As with the functionality selected the trim value is fixed when the programme lock bit is set.

Fifthly it will be understood that the enhanced and flexible design of the LC front end quenching oscillator permits greater sense distances to be achieved. Using existing head components with the ASCI will produce up to times three sense distance as compared to the prior art. The increase in sense distance capability is in part due to the improved temperature compensation arrangement available from the ASIC. Temperature compensation may be derived from a dual slope, variable slope, compensation technique that tracks the LC head and IC temperature changes with greater precision.

Sixthly, overcurrent protection may be provided as built-in output drivers, Sink or Source, can be monitored for a level of load current so enabling an overcurrent trip to be designed without the need of an external sense resistor as used in the prior art.

Seventhly over-temperature protection may be provided as the ASIC supports a band gap reference and this may be used with additional circuitry to provide automatic shutdown of the sensor when an over-temperature condition is reached.

It will finally be understood that the ASIC may be packaged or might be in bare die form (not packaged), for use, e.g. in a "chip-on-board" assembly procedure.

What is claimed is:

1. An inductive proximity sensor, comprising:
   a sensor head; and
   a programmable circuit coupled to the sensor head, the programmable circuit having a programming mode and a normal operating mode, where the programmable circuit automatically enters the programming mode upon an initial power up of the programmable circuit where one or more of a functional setting and/or a sense distance setting is programmed, and once the programming mode is exited, the programmable circuit automatically sets a lock flag that prevents the programmable circuit from re-entering the programming mode upon a subsequent power up of the programmable circuit, and causes the programmable circuit to enter the normal mode upon the subsequent power up.

2. The inductive proximity sensor of claim 1, wherein the programming mode executes an automatic trimming routine that automatically trims one or more components to accommodate a desired sense distance.

3. The inductive proximity sensor of claim 2, wherein a metal target is spaced from the sensor head by the desired sense distance when the programmable circuit is in the programming mode.

4. The inductive proximity sensor of claim 3, wherein the automatic trimming routine uses a successive approximation routine to automatically trim the one or more components.

5. The inductive proximity sensor of claim 1, wherein the functional setting selects between a normally closed and normally open output.

6. The inductive proximity sensor of claim 1, wherein in the programming mode, the functional setting is selected based upon a magnitude of a voltage applied to a pin of the inductive proximity sensor.

7. The inductive proximity sensor of claim 6, wherein the voltage is applied to a code block that generates a functional code that is applied to a plurality of fuses so as to blow one or more of the fuses to program the functional setting of the programmable circuit.

8. The inductive proximity sensor of claim 1, wherein in the programming mode, the sense distance setting is programmed based on a distance a metal target is placed from the sensor head when the programmable circuit is in the programming mode.

9. The inductive proximity sensor of claim 1, wherein the programmable circuit includes an oscillator that produces an oscillator signal whose amplitude is quenched when a metal target is brought into proximity to the sensor head.

10. The inductive proximity sensor of claim 1, wherein the amplitude of the oscillator signal is voltage controlled.

11. A method for programming an inductive proximity sensor, comprising:
    placing a target a target distance from a sensor head of a inductive proximity sensor;
    powering up the inductive proximity sensor for a first time;
    entering a programming mode;
    once in the programming mode, execute an automatic trimming routine that automatically trims one or more components of the inductive proximity sensor to set a sense distance setting of the inductive proximity sensor to the target distance;
    setting a lock bit that prevents the inductive proximity sensor from re-entering the programming mode upon a subsequent power up; and
    exiting the programming mode.

12. The method of claim 11, wherein during subsequent power ups, the inductive proximity sensor enters a normal mode of operation rather than the programming mode.

13. The method of claim 11, wherein the automatic trimming routine uses a successive approximation routine to automatically trim the one or more components.

14. The method of claim 11, wherein once in the programming mode, setting a functional setting of the inductive proximity sensor.

15. The method of claim 14, wherein the functional setting is selected based upon a magnitude of a voltage applied to a pin of the inductive proximity sensor.

16. The method of claim 15, wherein the voltage may be applied to a code block that generates a functional code that is applied to a plurality of fuses so as to blow one or more of the fuses to program the functional setting of the inductive proximity sensor.

17. A method for programming an inductive proximity sensor, comprising:
    powering up the inductive proximity sensor for a first time;
    entering a programming mode;
    applying a predetermined signal to a pin of the inductive proximity sensor;
    once in the programming mode, programming a functional setting of the inductive proximity sensor based upon a characteristics of the predetermined signal that is applied to the pin of the inductive proximity sensor;
    setting a lock bit that prevents the inductive proximity sensor from re-entering the programming mode upon a subsequent power up; and
    exiting the programming mode.

18. The method of claim 17, further comprising:
    placing a target a target distance from a sensor head of a inductive proximity sensor;
    once in the programming mode, executing an automatic trimming routine that automatically trims one or more components of the inductive proximity sensor to set a sense distance setting of the inductive proximity sensor to the target distance.

19. The method of claim 17, wherein the predetermined signal may be applied to a code signal block that generates a code that is applied to a plurality of fuses so as to blow one or more of the fuses to program the functional setting of the inductive proximity sensor.

20. The method of claim 17, wherein during all subsequent power ups after the first time, the inductive proximity sensor enters a normal mode of operation rather than the programming mode.

* * * * *